United States Patent
Cheng

(10) Patent No.: US 7,585,716 B2
(45) Date of Patent: Sep. 8, 2009

(54) HIGH-K/METAL GATE MOSFET WITH REDUCED PARASITIC CAPACITANCE

(75) Inventor: Kangguo Cheng, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/769,150

(22) Filed: Jun. 27, 2007

(65) Prior Publication Data

US 2009/0001480 A1    Jan. 1, 2009

(51) Int. Cl.
*H01L 21/338* (2006.01)
(52) U.S. Cl. .............................. 438/183; 257/E21.453; 438/926
(58) Field of Classification Search .......... 257/E21.453, 257/900, 386; 438/900, 183
See application file for complete search history.

(56) References Cited

U.S. PATENT DOCUMENTS

| | | | |
|---|---|---|---|
| 5,985,726 A * | 11/1999 | Yu et al. ..................... | 438/301 |
| 6,194,748 B1 | 2/2001 | Yu | |
| 6,210,999 B1 * | 4/2001 | Gardner et al. .............. | 438/183 |
| 6,403,426 B1 * | 6/2002 | Montree et al. ............. | 438/291 |
| 6,476,454 B2 * | 11/2002 | Suguro ....................... | 257/410 |
| 6,509,612 B2 | 1/2003 | Clevenger et al. | |
| 6,664,592 B2 * | 12/2003 | Inumiya et al. ............. | 257/330 |
| 6,696,333 B1 | 2/2004 | Zheng et al. | |
| 6,713,357 B1 | 3/2004 | Wang et al. | |
| 6,787,827 B2 * | 9/2004 | Inumiya et al. ............. | 257/288 |
| 6,864,145 B2 * | 3/2005 | Hareland et al. ............ | 438/302 |
| 6,879,009 B2 | 4/2005 | Zheng et al. | |
| 6,890,807 B2 | 5/2005 | Chau et al. | |
| 6,972,225 B2 | 12/2005 | Doczy et al. | |
| 6,974,764 B2 | 12/2005 | Brask et al. | |
| 7,078,750 B2 | 7/2006 | Hareland et al. | |
| 7,081,393 B2 | 7/2006 | Belyansky et al. | |
| 7,119,023 B2 | 10/2006 | Liaw | |
| 2002/0163036 A1 * | 11/2002 | Miura et al. ................ | 257/336 |
| 2003/0092276 A1 * | 5/2003 | Zhigang et al. ............. | 438/704 |

* cited by examiner

*Primary Examiner*—David Vu
*Assistant Examiner*—Brandon Fox
(74) *Attorney, Agent, or Firm*—Scully, Scott, Murphy & Presser, P.C.; H. Daniel Schnurmann

(57) ABSTRACT

The present invention provides a high-k gate dielectric/metal gate MOSFET that has a reduced parasitic capacitance. The inventive structure includes at least one metal oxide semiconductor field effect transistor (MOSFET) 100 located on a surface of a semiconductor substrate 12. The least one MOSFET 100 includes a gate stack including, from bottom to top, a high-k gate dielectric 28 and a metal-containing gate conductor 30. The metal-containing gate conductor 30 has gate corners 31 located at a base segment of the metal-containing gate conductor. Moreover, the metal-containing gate conductor 30 has vertically sidewalls 102A and 102B devoid of the high-k gate dielectric 28 except at the gate corners 31. A gate dielectric 18 laterally abuts the high-k gate dielectric 28 present at the gate corners 31 and a gate spacer 36 laterally abuts the metal-containing gate conductor 30. The gate spacer 36 is located upon an upper surface of both the gate dielectric 18 and the high-k gate dielectric that is present at the gate corners 31.

6 Claims, 6 Drawing Sheets

HIGH-K/METAL GATE MOSFET WITH REDUCED PARASITIC CAPACITANCE

FIELD OF THE INVENTION

The present invention relates to a semiconductor structure and a method of fabricating the same. More particularly, the present invention relates to a metal oxide semiconductor field effect transistor (MOSFET) including a high dielectric constant (k) gate dielectric and a metal-containing gate conductor that has reduced parasitic capacitance. The present invention also provides a method of fabricating such a MOSFET.

BACKGROUND OF THE INVENTION

In the semiconductor industry, a gate stack including a high-k gate dielectric (a gate dielectric having a dielectric constant of greater than 4.0, typically greater than 7.0) and a metal gate is one of the most promising options for continuing complementary metal oxide semiconductor (CMOS) scaling.

One of the process schemes for fabricating a high-k/metal gate MOSFET is a replacement gate method. In a replacement gate process, a MOSFET can be fabricated using a sacrificial gate electrode. In such a process, the sacrificial gate electrode is formed first and thereafter the sacrificial gate electrode is replaced by a gate stack including a high-k gate dielectric and a metal gate. Since the gate stack including the high-k gate dielectric and the metal gate is formed after high temperature processing steps such as a source/drain activation anneal, the replacement gate process has the advantage of minimal damage on the high-k gate dielectric and the metal gate. Moreover, a wide range of metals can be selected for the gate conductor.

One severe drawback of a conventional gate replacement process results in the high-k gate dielectric being present not only beneath the metal gate, but also on vertical sidewalls of the metal gate.

FIG. 1 is a pictorial representation of a prior art MOSFET including a gate stack comprising a high-k gate dielectric and a metal gate which is fabricated using a conventional gate replacement process as mentioned above. In particular, FIG. 1 shows a prior art MOSFET structure that includes a semiconductor substrate 1000 that has source/drain diffusion regions 1004 located therein. The semiconductor substrate 1000 also contains trench isolation regions 1006 that are filled with a trench dielectric material. Atop the semiconductor substrate 1000, there is shown a high-k gate dielectric 1008, which is formed in the shape of a "U", and a metal gate 1010 located within the U-shaped high-k gate dielectric 1008. A dielectric spacer 1012 is located on outer vertical sidewalls of the U-shaped high-k gate dielectric 1008. The structure shown in FIG. 1 also includes an interlevel dielectric material 1020 that has contact vias 1022 located therein which extend to the upper surface of the source/drain diffusion regions 1004. The interlevel dielectric material 1020 is laterally separated from the gate stack by the dielectric spacer 1012.

The presence of the metal gate 1010 on the vertical sidewalls of the U-shaped high-k gate dielectric 1008 results in an undesired high contact-to-gate conductor parasitic capacitance.

Another problem associated with a high-k gate dielectric is that the high-k gate dielectric at the gate corners (represented by the dotted circle shown in FIG. 1) may not be ideal due to variations in thickness and/or chemical component. A conventional gate reoxidation process cannot be used to strengthen the high-k gate dielectric at the gate corners because the high-k gate dielectric is sealed by the metal gate and the dielectric spacer. The non-ideal high-k gate dielectric at the gate corners results in high leakage and poor reliability.

In view of the above, there is a need for a new and improved high-k/metal gate MOSFET with reduced contact-to-gate conductor parasitic capacitance and, optionally, an improved high-k gate dielectric at the gate corners.

SUMMARY OF THE INVENTION

The present invention provides a high-k gate dielectric/metal gate MOSFET that has a reduced contact-to-gate conductor parasitic capacitance as compared to a high-k gate dielectric/metal gate MOSFET fabricated using a conventional gate replacement process. In the present invention, a reduction in the contact-to-gate conductor parasitic capacitance of about 10% or greater is achieved as compared with that of a prior art high-k gate dielectric/metal conductor MOSFET made using a conventional gate replacement process.

The present invention also provides a high-k gate dielectric/metal gate MOSFET in which an improved high-k gate dielectric is present at the gate corners.

The present invention further provides, in some embodiments, a high-k gate dielectric/metal gate MOSFET that includes a low-k dielectric spacer located on vertical sidewalls of the metal gate. The low-k dielectric spacer employed has a dielectric constant of less than 4, preferably less than 3.5. The presence of the low-k dielectric spacer aids in further lowering the contact-to-gate conductor parasitic capacitance.

The present invention even further provides a high-k gate dielectric/metal gate MOSFET in which a channel region located beneath the high-k gate dielectric/metal gate stack has a length of about 2 μm or less.

In general terms, the present invention provides a semiconductor structure that comprises:

at least one metal oxide semiconductor field effect transistor (MOSFET) located on a surface of a semiconductor substrate, said at least one MOSFET comprising a gate stack including, from bottom to top, a high-k gate dielectric and a metal-containing gate conductor, said metal-containing gate conductor having gate corners located at a base segment of the metal-containing gate conductor, wherein said metal-containing gate conductor has vertical sidewalls devoid of said high-k gate dielectric except at said gate corners;

a gate dielectric laterally abutting said high-k gate dielectric present at said gate corners; and a gate spacer laterally abutting said metal-containing gate conductor and located upon an upper surface of both the gate dielectric and the high-k gate dielectric that is present at the gate corners.

The inventive structure further comprises an interlevel dielectric material which contains conductively filled contact vias that extend to the surface of the semiconductor substrate which includes source/drain diffusion regions of the at least one MOSFET.

In some embodiments of the present invention, the inventive structure may further include a spacer liner present between the gate spacer and the interlevel dielectric material, the metal-containing gate conductor, and the upper surface of both the gate dielectric and the high-k gate dielectric that is present at the gate corners.

In yet another embodiment of the present invention, the gate spacer is a low-k dielectric material (dielectric constant of less than 4). In a further embodiment, the gate spacer includes a void present in the interior thereof which lowers the effective dielectric constant of the gate spacer.

In an even further embodiment of the present invention, the high-k gate dielectric present at the gate corners is strengthened by introducing oxygen and/or nitrogen into the material which is present at the gate corners.

In addition to the general semiconductor structure mentioned above, the present invention also provides a semiconductor structure that comprises:

at least one metal oxide semiconductor field effect transistor (MOSFET) located on a surface of a semiconductor substrate, said at least one MOSFET comprising a gate stack including, from bottom to top, a high-k gate dielectric and a metal-containing gate conductor, said metal-containing gate conductor having gate corners located at a base segment of the metal-containing gate conductor, wherein said metal-containing gate conductor has vertical sidewalls devoid of said high-k gate dielectric except at said gate corners, said high-k gate dielectric at said gate corners has increased bonding as compared to said high-k gate dielectric that is located directly beneath said metal-containing gate conductor;

a gate dielectric laterally abutting said high-k gate dielectric present at said gate corners; and a gate spacer laterally abutting said metal-containing gate conductor and located upon an upper surface of both the gate dielectric and the high-k gate dielectric that is present at the gate corners.

In another embodiment, the present invention provides a semiconductor structure that comprises:

at least one metal oxide semiconductor field effect transistor (MOSFET) located on a surface of a semiconductor substrate, said at least one MOSFET comprising a gate stack including, from bottom to top, a high-k gate dielectric and a metal-containing gate conductor, said metal-containing gate conductor having gate corners located at a base segment of the metal-containing gate conductor, wherein said metal containing gate conductor has vertical sidewalls devoid of said high-k gate dielectric except at said gate corners;

a gate dielectric laterally abutting said high-k gate dielectric present at said gate corners; and a low-k gate spacer that includes voids in the interior thereof laterally abutting said metal-containing gate conductor and located upon an upper surface of both the gate dielectric and the high-k gate dielectric that is present at the gate corners.

In addition to the semiconductor structure described above, the present invention also provides a method of fabricating such a semiconductor structure. In general terms, the method of the present invention includes:

providing a structure including a sacrificial gate conductor and a gate dielectric located on a semiconductor substrate, said structure further including an interlevel dielectric located on said semiconductor substrate and separated from said sacrificial gate by a sacrificial spacer;

removing the sacrificial gate and a portion of the gate dielectric that is not protected by the sacrificial spacer to form an opening that exposes a surface of the semiconductor substrate;

forming a U-shaped high-k gate dielectric and a metal-containing gate conductor inside the opening;

removing the sacrificial spacer to expose a portion of the U-shaped high-k gate dielectric that laterally abuts sidewalls of the metal-containing gate conductor;

removing substantially all of the exposed portion of the high-k gate dielectric that laterally abuts the sidewalls of the metal-containing gate conductor from the gate sidewalls; and forming a gate spacer in an area that previously included the sacrificial spacer and a portion of the U-shaped high-k gate dielectric.

DETAILED DESCRIPTION OF THE INVENTION

The present invention which provides a high-k gate dielectric/metal-containing MOSFET having at least reduced contact-to-gate conductor parasitic capacitance and a method of fabricating the same, will now be described in greater detail by referring to the following description and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Also, it is observed that although the following description and drawings show the presence of a single high-k gate dielectric/metal-containing conductor MOSFET, the present invention is not limited to the same. Instead, a plurality of high-k gate dielectric/metal-containing conductor MOSFETs can be formed utilizing the method of the present invention. The plurality of high-k gate dielectric/metal-containing conductor MOSFETs that can be formed may all have the same conductivity (i.e., nMOSFETs or pMOSFETs). Alternatively, the plurality of high-k gate dielectric/metal-containing conductor MOSFETs can include a first set of MOSFETs having a first conductivity (nMOSFETs or pMOSFETs) and a second set of MOSFETs having a second conductivity that differs from the first conductivity type MOSFET.

As stated above, the present invention provides a high-k gate dielectric/metal gate MOSFET that has a reduced contact-to-gate conductor parasitic capacitance as compared to a high-k gate dielectric/metal gate MOSFET fabricated using a conventional gate replacement process.

Figure 1:
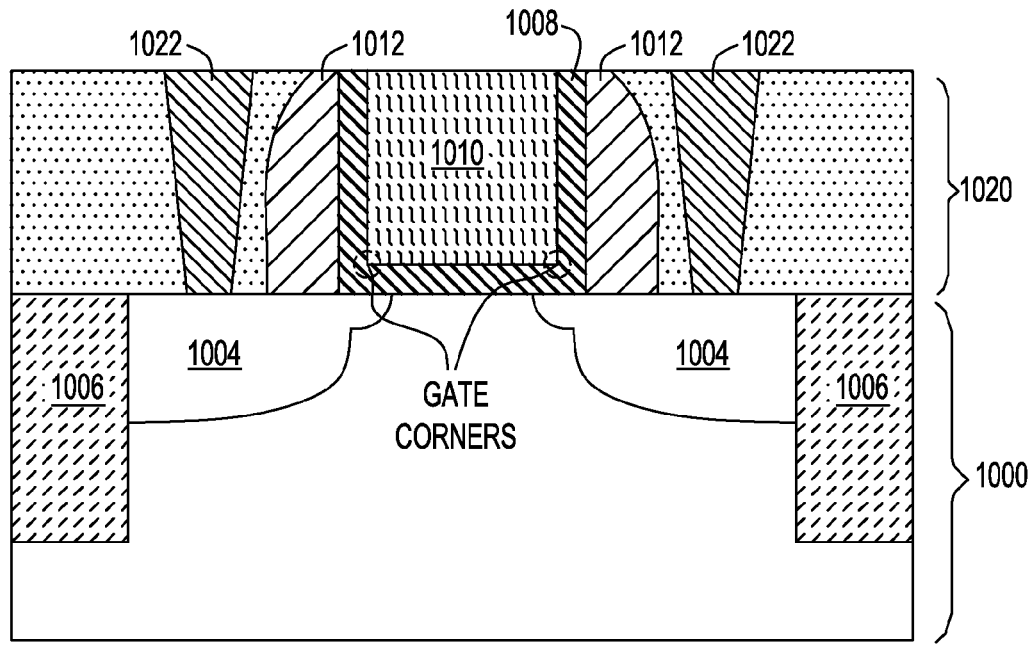
FIG. 1 is a pictorial representation (through a cross sectional view) illustrating a prior art high-k gate dielectric/metal conductor MOSFET that was fabricated utilizing a conventional gate replacement process.
Figure 2A:
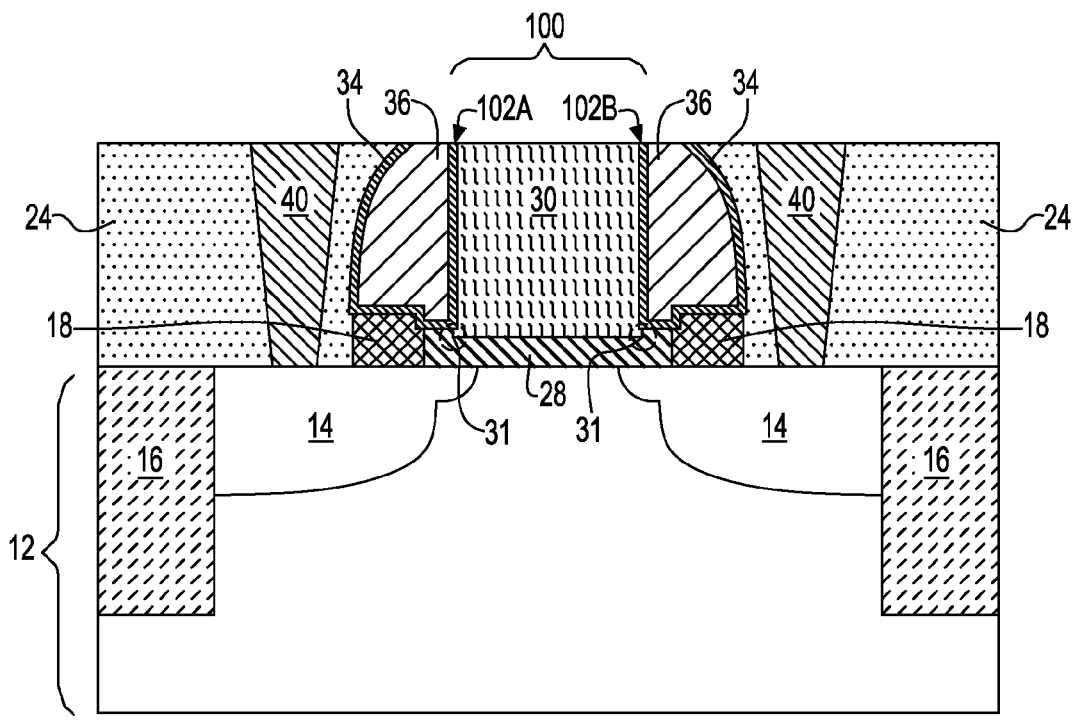
FIGS. 2A, 2B and 2C are pictorial representations (through cross sectional views) illustrating high-k gate dielectric/metal-containing conductor MOSFETs in accordance with three embodiments of the present invention.
Figure 2B:
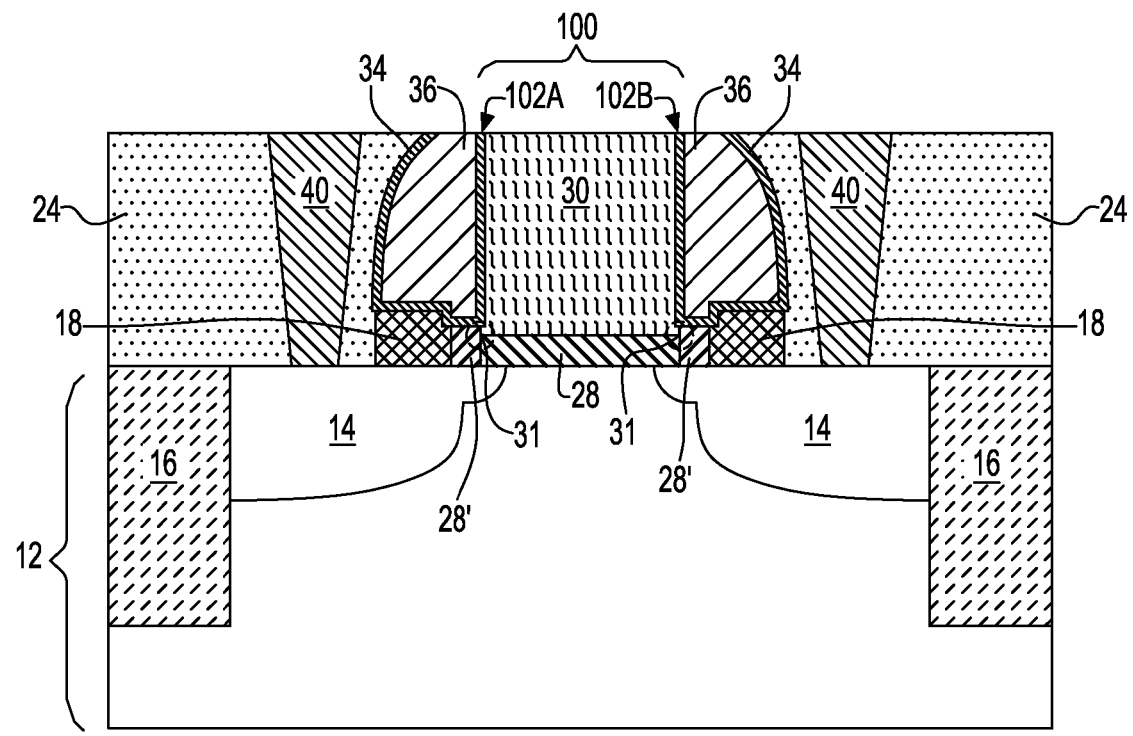
Figure 2C:
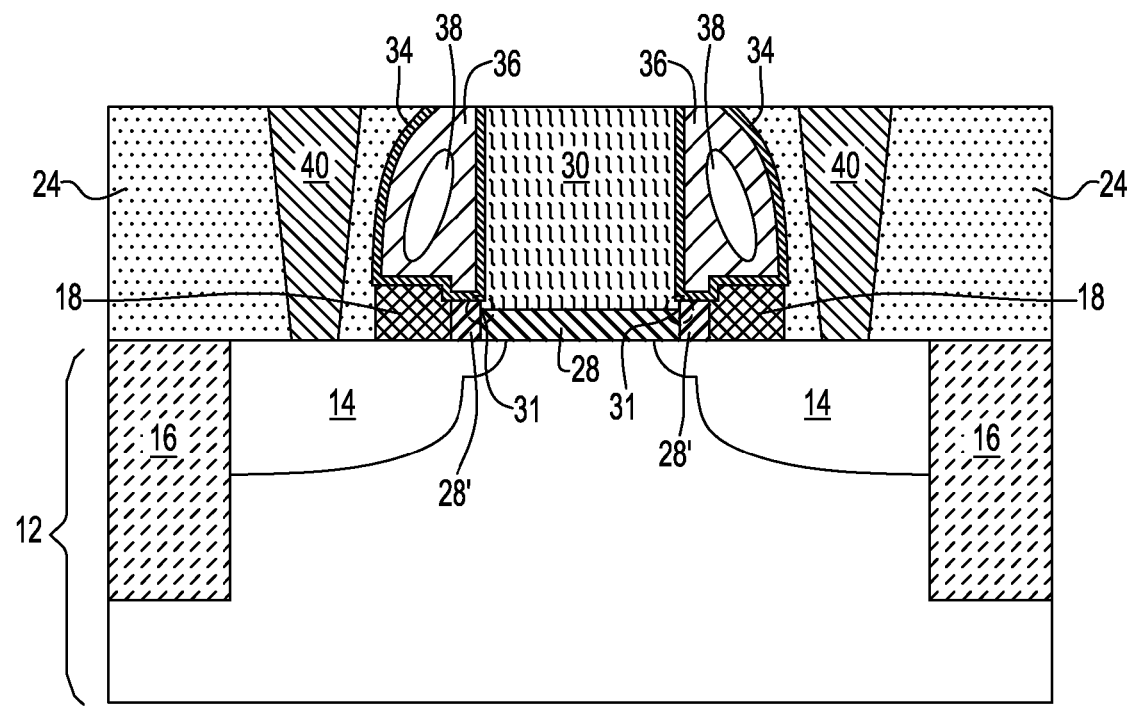

FIGS. 2A-2C shows various structural embodiments of the present invention. In FIG. 2A, a first embodiment of the present invention is shown. The structure shown in FIG. 2A includes at least one metal oxide semiconductor field effect transistor (MOSFET) 100 located on a surface of a semiconductor substrate 12. The least one MOSFET 100 includes a gate stack including, from bottom to top, a high-k gate dielectric 28 and a metal-containing gate conductor 30. The metal-containing gate conductor 30 has gate corners 31 located at a base segment of the metal-containing gate conductor. The base segment of the metal-containing gate is defined herein as the region of the gate conductor wherein the vertical sidewalls come into contact with the bottom wall of the gate conductor. Moreover, the metal containing gate conductor 30 has vertical sidewalls 102A and 102B devoid of the high-k gate dielectric 28 except at the gate corners 31; the term "vertical sidewalls" is used to denote sidewalls that are perpendicular to a common bottom wall or they may have some tapering associated therewith. Also shown in FIG. 2A, is a gate dielectric 18 that laterally abuts the high-k gate dielectric 28 present at the gate corners 31 and a gate spacer 36 that laterally abuts the metal-containing gate conductor 30. The gate spacer 36 is located upon an upper surface of both the gate dielectric 18 and the high-k gate dielectric 28 that is present at the gate corners 31.

The inventive structure further comprises an interlevel dielectric material 24 which contains conductively filled contact vias 40 that extend to the surface of the semiconductor substrate 12 which includes source/drain diffusion regions 14 of the at least one MOSFET 100.

In some embodiments of the present invention, a spacer liner 34 is present between the gate spacer 36 and the interlevel dielectric material 24, the metal-containing gate conductor 30, and the upper surface of both the gate dielectric 18 and the high-k gate dielectric 28 that is present at the gate corners 31.

With respect to FIG. 2B, a second structural embodiment of the present invention is shown which comprises the same basic elements as that shown in FIG. 2A except that the high-k gate dielectric present at the gate corners has improved bonding as compared to the high-k gate dielectric that is located directly beneath the metal-containing gate conductor. In FIG. 2B, reference numeral 28' denotes the high-k gate dielectric present at the gate corners 31 that has improved bonding, while reference numeral 28 denotes the high-k gate dielectric directly beneath the metal-containing gate conductor 30.

FIG. 2C illustrates a third structural embodiment of the present invention. Specifically, the structure shown in FIG. 2C comprises the same elements in FIG. 2B except that the gate spacer 36 includes a void 38 in the interior thereof. The presence of the void 38 lowers the effect dielectric constant of the gate spacer 36.

Reference is now made to FIGS. 3A-3H which illustrate the basic processing steps that can be used in fabricating the inventive structures shown in FIGS. 2A-2C. The processing steps of the present invention include first forming a conventional MOSFET with a dummy (i.e., sacrificial) gate, a gate dielectric, a sacrificial spacer and an interlevel dielectric. The sacrificial gate and the gate dielectric not protected by the sacrificial spacer are then removed to form an opening that exposes a surface of a semiconductor substrate. A U-shaped high-k gate dielectric and then a metal-containing gate conductor are formed inside the opening. The sacrificial spacer is then removed to expose a portion of the high-k gate dielectric that laterally abuts sidewalls of the metal-containing gate conductor. The exposed portion of the high-k gate dielectric that laterally abuts the sidewalls of the metal-containing gate conductor is then removed from the gate sidewalls and thereafter a spacer is formed.

Figure 3A:
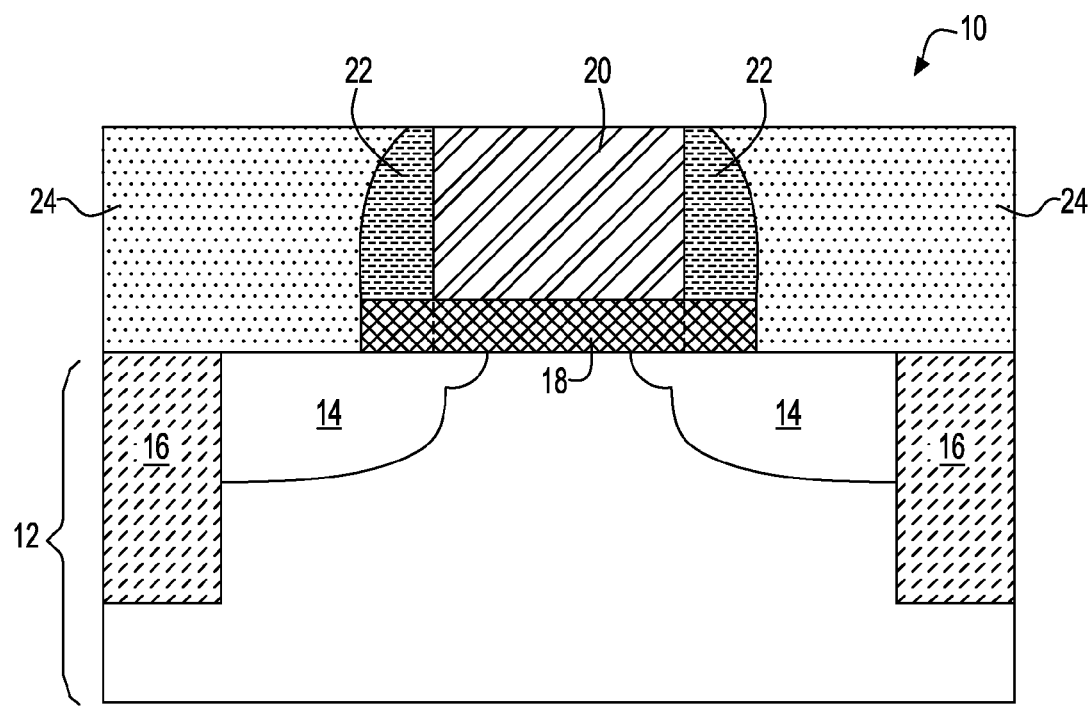
FIGS. 3A-3H are pictorial representations (through cross sectional views) illustrating the basic processing steps that can be used in fabricating the structures shown in FIGS. 2A-2C.
Figure 3B:
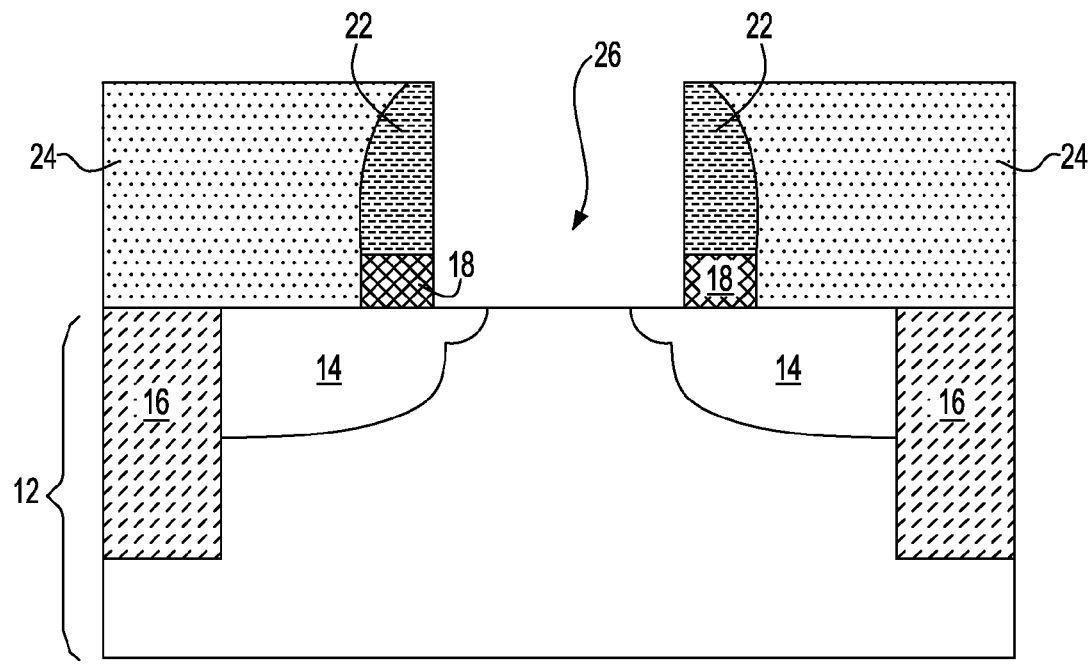

Reference is first made to FIG. 3A which illustrates an initial semiconductor structure 10 that can be employed in the present invention. As is illustrated, the initial semiconductor structure 10 includes a semiconductor substrate 12 that has been processed to include at least one isolation region 16 and source/drain regions 14. A silicide layer (not shown) may be present at the surface of the source/drain regions to lower the resistance. The semiconductor substrate 12 further includes a gate dielectric 18 located on a surface of substrate 12. The gate dielectric 18 has a central portion that has a sacrificial gate 20 located thereon and outer edge portions that abut the central portion that each has a sacrificial spacer 22 located thereon. The vertical dotted lines are provided in FIG. 3A to shows the mythical boundaries between the central portion of the gate dielectric and the outer portions of the gate dielectric.

The structure shown in FIG. 3A also includes an interlevel dielectric material 24 located on portions of the semiconductor substrate 12 not including the gate dielectric 18, sacrificial gate 20 and sacrificial spacer 22. As is shown, the interlevel dielectric 24 has an upper surface that is coplanar to an upper surface of the sacrificial gate 20.

The semiconductor substrate 12 shown in FIG. 3A includes any material that exhibits semiconductor properties. Examples of materials that exhibit semiconductor properties include, but are not limited to Si, SiGe, SiC, SiGeC, Ge, Ga, GaAs, InAs, InP and all other III/V or II/VI compound semiconductors. The semiconductor substrate 12 may also comprise an organic semiconductor or a layered semiconductor such as, for example, Si/SiGe, a silicon-on-insulator or a SiGe-on-insulator. In some embodiments of the present invention, it is preferred that the semiconductor substrate 12 comprises a Si-containing semiconductor material, i.e., a semiconductor material that includes silicon. In addition to the aforementioned types of semiconductor substrates, the semiconductor substrate 12 employed in the present invention may also comprise a hybrid oriented (HOT) semiconductor substrate in which the HOT substrate has surface regions of different crystallographic orientation.

The semiconductor substrate 12 may be doped, undoped or contain doped regions and undoped regions therein. The semiconductor substrate 12 may be strained, unstrained, contain regions of strain and unstrain therein, or contain regions of tensile strain and compressive strain.

Each isolation region 16 shown in FIG. 3A may include a trench dielectric material such as an oxide and, optionally, a liner such as silicon nitride or silicon oxynitride may be present on the sidewalls of the trench. The trench isolation region 16 is formed in the semiconductor substrate 12 prior to forming the other elements shown in FIG. 3A utilizing a conventional trench isolation process that includes first etching at least one trench in the semiconductor substrate 12, optionally filling the at least one trench with a trench liner and thereafter filling the trench with a trench dielectric material. After trench fill, a conventional planarization process such as, for example, chemical mechanical polishing and/or grinding, is used to provide a planar structure. In some embodiments, a densification process can be performed after filling the trench with the trench dielectric material.

It is noted that the formation of trench isolation regions is typically performed in the presence of a pad layer (not shown) that is removed from the structure after forming the at least one trench isolation region 16 in the semiconductor substrate 12. The pad layer may comprise silicon nitride and optionally an underlying silicon oxide. Any conventional stripping process that selectively removes the pad layer can be used to remove the pad layer from the structure.

Alternatively, each isolation region 16 can be formed by other well known methods such as LOCOS (Local Oxidation Of Silicon).

At this point of the present invention one of two different processing sequences can be used to fabricate the structure shown in FIG. 3A. In a first processing sequence in which a conventional CMOS processing flow is used, a blanket layer of gate dielectric 18 is formed atop the entire surface of the semiconductor substrate 12 including atop the trench isolation regions 16. The blanket layer of gate dielectric 18 can be formed by a conventional deposition process including, for example, chemical vapor deposition (CVD), low pressure chemical vapor deposition (LPCVD), plasma enhanced chemical vapor deposition (PECVD), evaporation, chemical solution deposition, and atomic layer deposition (ALD). Alternatively, thermal oxidation, nitridation or oxynitridation can be used to form the blanket layer of gate dielectric 18. The blanket layer of gate dielectric 18 has a thickness that is thicker that that of the high-k gate dielectric to be subsequently formed. Typically, the thickness of the gate dielectric 18 is from about 2 to about 20 nm, with a thickness from about 3 to about 10 nm being even more typical. The gate dielectric 18 is typically an oxide of a semiconductor material, with an oxide of silicon being more typical.

After forming the blanket layer of gate dielectric 18, a blanket layer of sacrificial gate material (e.g., polysilicon or silicon germanium) is formed utilizing a conventional deposition process including, for example, CVD, LPCVD, PECVD, evaporation, chemical solution deposition and physical vapor deposition (PVD). The blanket layer of sacrificial gate material (which forms the sacrificial gate 20) has a thickness from about 20 to about 200 nm after deposition, with a thickness from about 50 to about 100 nm being even more typical.

A patterning process that includes lithography and etching is then used to pattern the blanket layer of sacrificial gate material into the sacrificial gate 20 shown in FIG. 3A. The lithographic step includes applying a photoresist to the surface of the blanket layer of sacrificial gate material, exposing the photoresist to a desired pattern of radiation and then developing the exposed resist. The etching step includes dry etching or wet etching. Preferably, a dry etching process such as reactive ion etching, ion beam etching and plasma etching is employed. The etching process stops on a surface of the gate dielectric 18. After etching, the exposed and developed photoresist is removed from the structure utilizing a conventional resist stripping process such as, for example, ashing.

At this point, the source/drain regions 14 are formed into the semiconductor substrate 12. Each source/drain region 14 may further comprise a source/drain extension region which is partially overlapped with the sacrificial gate 20. Forming source/drain and source/drain extension may include utilizing conventional ion implantation process, spacer formation, and dopant activation anneal that are well known in the art.

Sacrificial spacer 22 is then formed on vertical sidewalls of the sacrificial gate 20 and atop a surface of the blanket layer of gate dielectric 18 by deposition and etching. The sacrificial spacer 22 is comprised of a nitride-containing material such as silicon nitride or silicon oxynitride. The sacrificial spacer 22 can be formed before or after the formation of the source and drain regions. If source/drain extension is formed, the sacrificial spacer 22 can be formed before or after the formation of the source/drain extension.

Next, the blanket layer of gate dielectric 18 is etched utilizing the sacrificial spacer 22 and the sacrificial gate 20 as an etching mask.

A blanket layer of the interlevel dielectric material 24 is formed covering all exposed surfaces of the structure. The interlevel dielectric material 24 is formed utilizing any conventional deposition process including, for example, chemical vapor deposition (CVD), low pressure chemical vapor deposition (LPCVD), plasma enhanced chemical vapor deposition (PECVD), sub-atmospheric chemical vapor deposition (SACVD), evaporation, chemical solution deposition, and spin-on-coating. The interlevel dielectric material 24 includes any conventional dielectric material such as, for example, silicon dioxide, a silicate glass, a silsesquioxane, an organosilicate that includes atoms of Si, C, O and H, and a thermosetting polyarylene ether. The term "polyarylene" is used to denote aryl moieties that are linked together by bonds, fused rings, or inert linking groups such as, for example, oxygen, sulfur, sulfone, sulfoxide, carbonyl and the like.

A planarization process such as, for example, chemical mechanical polishing and/or grinding is then used to form a coplanar structure such as is shown in FIG. 3A.

In another processing sequence, the initial structure shown in FIG. 3A is formed by first processing the substrate 12 to include the isolation regions 16. Next, the interlevel dielectric material 24 is formed and lithography and etching are used to define at least one opening in the dielectric material that exposes a surface of the semiconductor substrate 12. The source/drain regions 14 can be formed at this point and thereafter the gate dielectric 18 is formed into the bottom of the opening. Next, the sacrificial spacer 22 is formed on the exposed sidewalls of the patterned interlevel dielectric material 24 and then the sacrificial gate 20 is formed. A planarization process is then typically used to provide the coplanar structure shown in FIG. 3A. This embodiment of the present invention is typically employed to form a device channel whose length is about 2 μm or less.

After providing the initial structure 10 shown in FIG. 3A, the sacrificial gate 20 and the sacrificial gate dielectric 18 that is located directly beneath the sacrificial gate 20 is removed from the structure. The removal of the sacrificial gate 20 and the gate dielectric 18 beneath the sacrificial gate 20 provides an opening 26 which exposes a surface of the semiconductor substrate 12. The resultant structure that is formed after this step of the present invention has been performed is shown, for example, in FIG. 3B. Depending on the materials of the sacrificial gate 20 and the gate dielectric 18, various suitable processes can be used to remove those materials. For example, a wet etching process with an etchant containing ammonia-based chemistry or a dry etching process such as a plasma etch with an etchant containing sulfuric fluoride can be used to remove the sacrificial gate 20 comprising polysilicon. A wet etching process with an etchant of hydrofluoride acid can be used to remove the gate dielectric 18 comprising silicon oxide.

Figure 3C:
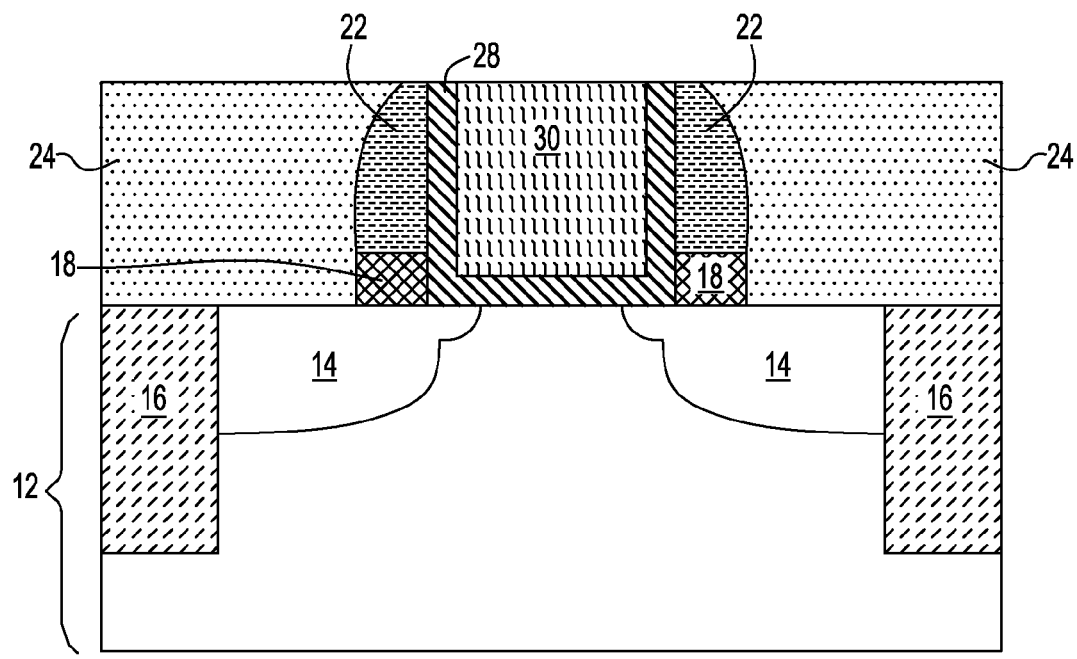

Next, a U-shaped high-k gate dielectric 28 is formed within the opening 26 and thereafter a metal-containing conductor 30 is formed on the exposed surfaces of the U-shaped high-k gate dielectric 28 providing the structure shown, for example, in FIG. 3C. The U-shaped high-k gate dielectric 28 comprises any dielectric material whose dielectric constant is greater than 4.0, typically greater than 7.0. Examples of such high-k gate dielectric materials include but are not limited to $TiO_2$, $Al_2O_3$, $ZrO_2$, $HfO_2$, $Ta_2O_5$, $La_2O_3$, mixed metal oxides such a perovskite-type oxides, and combinations and multilayers thereof. Silicates and nitrides of the aforementioned metal oxides can also be used as the high-k gate dielectric material.

Optionally, a first interfacial layer (not shown) can be formed at the interface between the U-shaped high-k gate dielectric 28 and the substrate 12 to improve device characteristics such as reducing interface traps. The first interfacial layer, if present, may comprise silicon oxide, silicon nitride, or oxynitride and can be formed by thermal oxidation, chemical oxidation, thermal nitridation, and chemical nitridation. Furthermore, a second interfacial layer (not shown) can be deposited at the top or within the U-shape high-k dielectric 28 before forming the metal-containing gate conductor 30. The second interfacial layer, if present, helps optimize device characteristics by adjusting the work function, and/or stabilizing the flatband voltage and threshold voltage. The second interfacial layer, if present, may comprise a rare earth-containing layer comprising $La_2O_3$, LaN, or any other suitable materials. The U-shaped high-k gate dielectric 28 can be formed by a conventional deposition process, including but not limited to, atomic layer deposition (ALD), chemical vapor deposition (CVD), low-pressure chemical vapor deposition (LPCVD), plasma enhanced chemical vapor deposition (PECVD), rapid thermal chemical vapor deposition (RTCVD), limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, ion beam deposition, electron beam deposition, and laser assisted deposition.

The U-shaped high-k gate dielectric 28 has a thickness that is less than that of the remaining outer portions of the gate dielectric 18. Typically, the U-shaped high-k gate dielectric 28 has a thickness from about 1 to about 20 nm, with a thickness from about 2 to about 10 nm being even more typical.

The metal-containing gate conductor 30 is formed utilizing a conventional deposition process such as, for example, atomic layer deposition (ALD), chemical vapor deposition (CVD), metalorganic chemical vapor deposition (MOCVD), molecular beam epitaxy (MBE), physical vapor deposition, sputtering, plating, evaporation, ion beam deposition, electron beam deposition, laser assisted deposition, and chemical solution deposition. The metal-containing gate conductor 30 includes a conductive metal such as, but not limited to Al, W, Cu, Pt, Ag, Au, Ru, Ir, Rh and Re, alloys of a conductive metal, e.g., Al—Cu, silicides of a conductive metal, e.g., W silicide, and Pt silicide, nitrides of a conductive metal, e.g., AlN, and combinations and multilayers thereof. A conventional planarization process such as chemical mechanical polishing (CMP) can be used to remove any metal-containing gate conductor 30 that is deposited at the top of the interlevel dielectric 24 and the sacrificial spacer 22. A conventional etch process such as a wet etch or dry etch can be used to remove any U-shaped high-k gate dielectric 28 that is deposited at the top of the interlevel dielectric 24 and the sacrificial spacer 22.

Figure 3D:
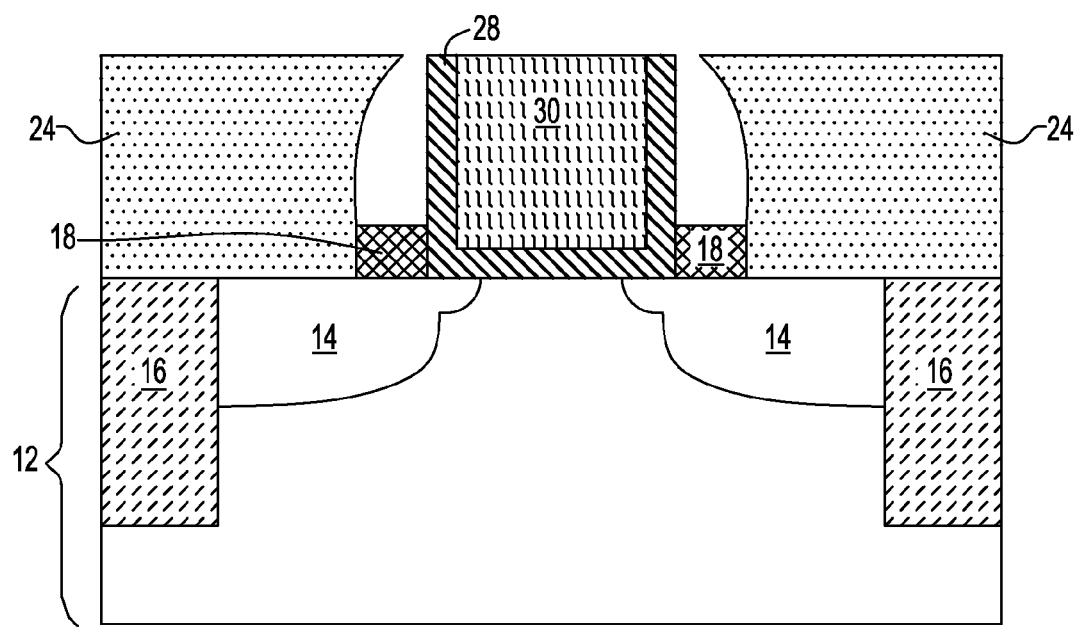

Next, and as shown in FIG. 3D, the sacrificial spacer 22 is removed from the structure exposing the remaining outer portions of the gate dielectric 18, outer sidewalls of the U-shaped high-k gate dielectric 28, and sidewalls of the interlevel dielectric material 24. The sacrificial spacer 22 is removed utilizing an etching process that selectively removes the material of the sacrificial spacer 22 as compared with the interlevel dielectric material 24 and the remaining gate dielectric 18. An example of such an etching process that can be used includes a wet etch process with an etch etchant containing phosphoric acid or a mix of hydrofluoric and ethylene glycol (HF/EG) to remove the sacrificial spacer 22 which is formed of silicon nitride. Alternatively, the sacrificial spacer 22, when it comprises silicon nitride, can be removed by a dry etch process such as a chemical downstream etch (CDE).

Figure 3E:
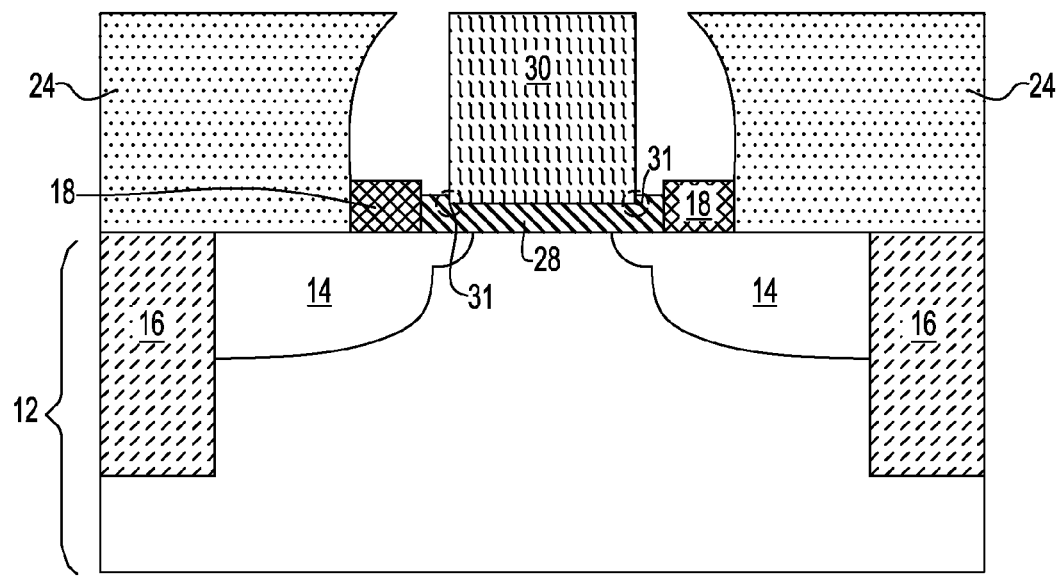
Figure 3F:
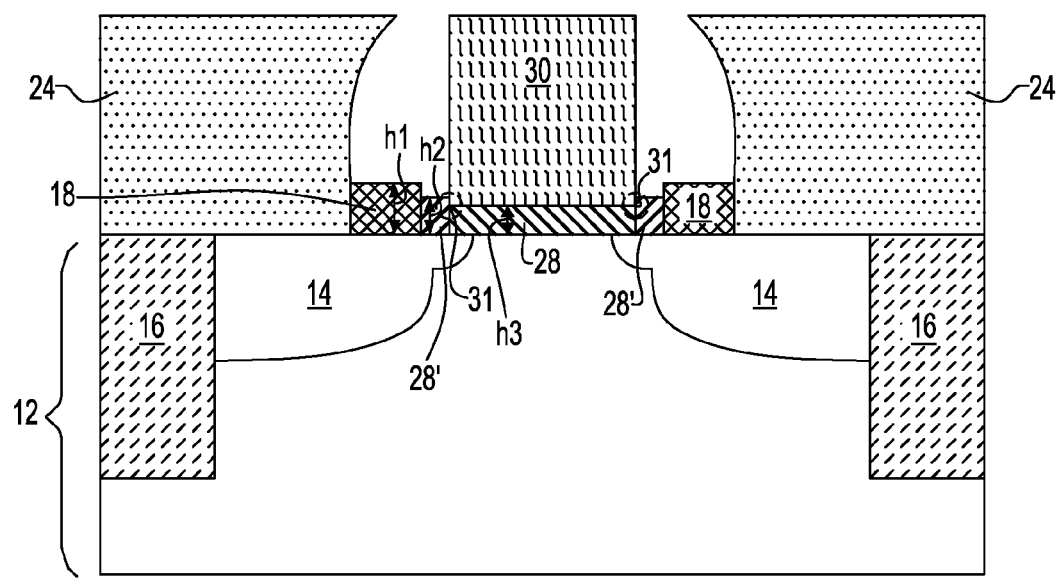

FIG. 3E shows the structure that is formed after removing the U-shaped high-k gate dielectric 28 from substantially all of the vertical sidewalls of the metal-containing gate conductor 30. The presence of the thicker gate dielectric 18 ensures that a substantially complete removal of the high-k gate material from the metal-containing gate sidewalls is obtained without undercutting the high-k gate dielectric material that is located beneath the metal-containing gate conductor 30. Removing substantially all of the high-k gate dielectric material from the vertical sidewalls of the metal-containing gate conductor 30 reduces the contact-to-gate conductor capacitance.

It is noted that some portion of the U-shaped high-k gate dielectric 28 however remains on the vertical sidewalls of the metal-containing gate conductor 30 covering the gate corners at the base segment of the metal-containing gate conductor 30. The gate corners are labeled by reference numeral 31 in FIG. 3E. In the present invention, the high-k gate material that remains at the gate corners 31 has a height that is less than the height of the remaining gate dielectric 18.

The removal of the U-shaped high-k gate dielectric 28 from substantially all of the vertical sidewalls of the metal-containing gate conductor 30 is performed utilizing an etching process that selectively removes the high gate dielectric material relative to that of the other materials that are exposed to the etching process. An example of such an etching process includes a boron-halogen plasma which comprises a boron-halogen compound (e.g., $BCl_3$) and nitrogen. Alternatively, the high-k gate dielectric 28 can be removed from the vertical sidewalls of the metal-containing gate conductor 30 simultaneously when removing the sacrificial spacer 22.

In some embodiments of the present invention, a portion of the remaining U-shaped high-k gate dielectric 28 that is not protected by the metal-containing gate conductor 30 which is located abutting the gate corners 31 may be strengthen to reduce the leakage and reliability concerns that may exist at the gate corners 31. When using a high-k gate dielectric material, increased leakage current and decreased reliability at the gate corners may exist due to stress and/or film deposition. The strengthened region of the remaining U-shaped high-k gate dielectric 28 is labeled as 28' in FIG. 3F.

The strengthening is achieved in the present invention by utilizing a low energy (on the order of about 20 KeV or less) oxygen ion and/or nitrogen ion implantation process. The dose of oxygen and/or nitrogen ions used is typically within a range from about 1E12 to about 1E15 atoms/$cm^2$, within a dose range from about 1E13 to about 1E14 atoms/$cm^2$ being more typical. Alternatively, a low temperature oxidation, nitridation or oxynitridation process (temperature on the order of about 950° C. or less) can be used to cause the above mentioned strengthen of the high-k gate material that is present at the gate corners 31. The net effect of performing one of the above-mentioned techniques is to improve the chemical bonding in the high-k gate dielectric material.

It is mentioned here that in the present invention the high-k gate dielectric 28 located directly beneath the gate conductor has a height $h_3$ that is less than the height $h_2$ of the remaining high-k gate dielectric at the gate corners and that the height $h_2$ of the remaining high-k gate dielectric at the gate corners is substantially the same or less than the height $h_1$ of the remaining gate dielectric 18. In other terms, the gate dielectric has a first height, the high-k gate dielectric that is present at the gate corners has a second height, and the high-k gate dielectric located directly beneath said metal-containing gate conductor has a third height, wherein said first height is substantially the same, or greater than, the second height, and said second height is greater than the third height.

The remaining drawings show the presence of the strengthened high-k gate dielectric regions 28' at the gate corners 31. Although this is illustrated in the remaining drawings, the processing that follows can be used when the optional strengthening step has been omitted.

Figure 3G:
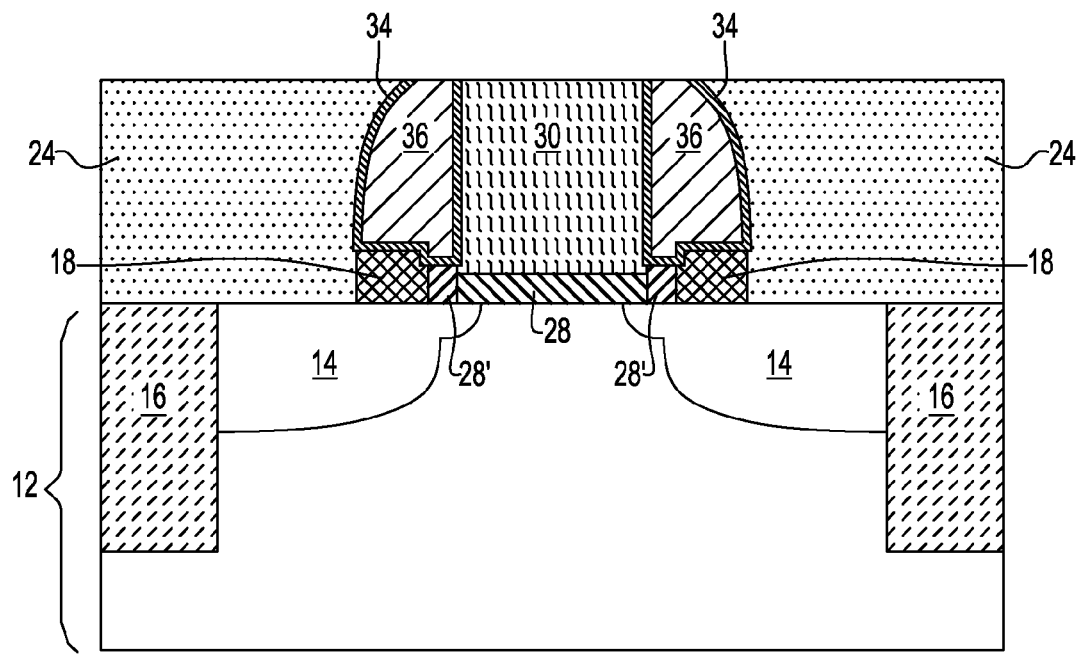

FIG. 3G shows the resultant structure that is formed after forming optional spacer liner 34 and gate spacer 36 within the space that was created when the sacrificial spacer 22 was removed and after substantially all of the high-k gate material located on the vertical sidewalls of the metal-containing gate conductor 20 was removed. The optional spacer liner 34 comprises a first dielectric material which is different from the second dielectric material used in forming the gate spacer 36. Typically, the spacer liner 34 is comprised of silicon nitride and the gate spacer 36 is comprised of silicon dioxide. In some embodiments, the gate spacer 36 is a low-k (dielectric constant of less than 4.0) dielectric material such as, for example, an organosilicate that includes atoms of at least Si, C, O and H, and the spacer liner 34 comprises silicon oxide.

The optional spacer liner 34 has a thickness after deposition that is from about 1 to about 10 nm, with about 2 to 5 nm being more typical. The optional spacer liner 34 can be formed by a deposition process such as, for example, atomic layer deposition (ALD), chemical vapor deposition (CVD), low-pressure chemical vapor deposition (LPCVD), plasma enhanced chemical vapor deposition (PECVD), sub-atmospheric chemical vapor deposition (SACVD), rapid thermal chemical vapor deposition (RTCVD), high temperature oxide deposition (HTO), low temperature oxide deposition (LTO), limited reaction processing CVD (LRPCVD), spin-on-coating, chemical solution deposition, or any other suitable process. The gate spacer 36 is formed by any suitable deposition process such as CVD and spin-on-coating. It is pointed out herein that a bottom surface of the gate spacer 36 is located atop, or directly on, both the remaining gate dielectric 18 and the high-k gate dielectric that is present at the gate corners 31. In a conventional prior art structure, the gate spacer is located directly on a surface of the semiconductor substrate.

In some embodiments of the present invention which is dependant on the geometry of the space in which the gate spacer 36 is to be formed and the deposition process used, a void 38 (see FIG. 2C) can be present in an interior portion of the gate spacer 36. The presence of the void has the effect of further reducing the effective dielectric constant of the gate spacer 36 that is employed in the present invention.

Figure 3H:
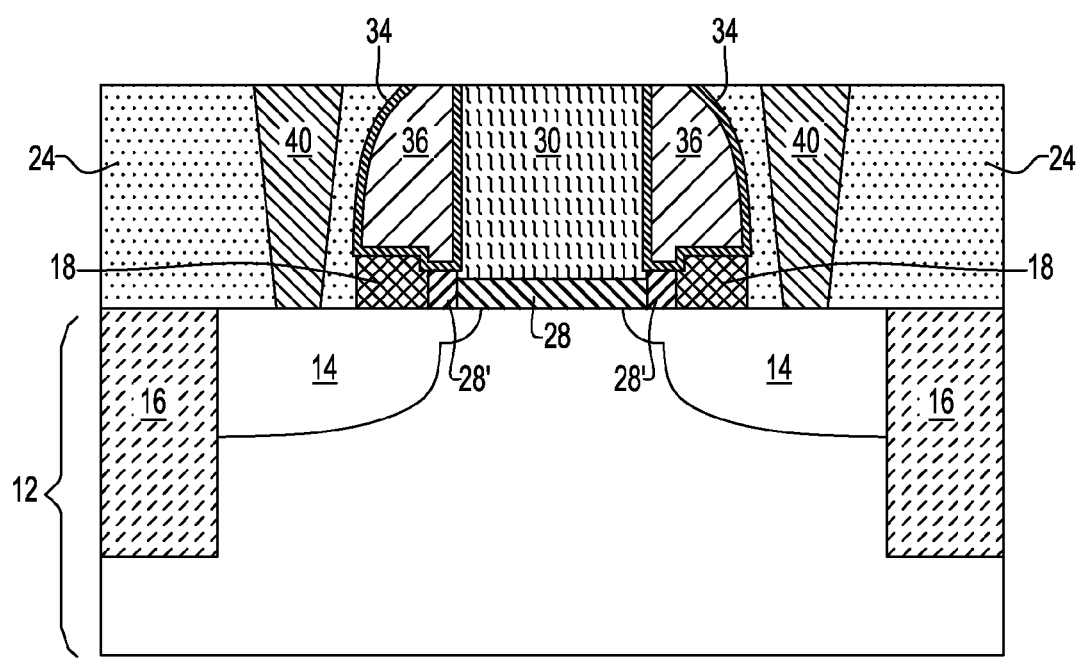

FIG. 3H illustrates the structure after conductively filled contact vias 40 are formed in the interlevel dielectric material 24 which extend to the surface of the semiconductor substrate 12 that includes the source/drain diffusion regions 14. The conductively filled contact vias 40 are formed by lithography, etching and filling the contact via thus formed with a conductive material. Optionally, a diffusion barrier such as TiN or TaN can be formed on the exposed sidewalls of the contact via prior to filling the via with the conductive material. The conductive material used in filling the contact openings includes any conductive material including one of the conductive materials used in forming the metal-containing gate conductor 30.

In some embodiments of the present invention, the conductively filled contacts vias 40 can be formed into the interlevel dielectric material 24 prior to removing the high-k gate dielectric 28 and the sacrificial spacer 22 from the vertical sidewall of the metal-containing gate conductor 30.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:

providing a structure including a sacrificial gate and a gate dielectric located on a semiconductor substrate, said structure further including an interlevel dielectric located on said semiconductor substrate and separated from said sacrificial gate by a sacrificial spacer;

removing the sacrificial gate and a portion of the gate dielectric that is not protected by the sacrificial spacer to form an opening that exposes a surface of the semiconductor substrate;

forming a U-shaped high-k gate dielectric and a metal-containing gate conductor inside the opening;

removing the sacrificial spacer to expose a portion of the U-shaped high-k gate dielectric that laterally abuts sidewalls of the metal-containing gate conductor;

removing substantially all of the exposed portion of the high-k gate dielectric that laterally abuts the sidewalls of the metal-containing gate conductor from the gate sidewalls; and forming a gate spacer in an area that previously included the sacrificial spacer and a portion of the U-shaped high-k gate dielectric to provide at least one MOSFET comprising a gate stack including, from bottom to top, the high-k gate dielectric and the metal-containing gate conductor, said metal-containing gate conductor having gate corners located at a base segment of the metal-containing gate conductor, wherein said metal-containing gate conductor has vertical sidewalls devoid of said high-k gate dielectric except at said gate corners, and wherein the gate dielectric is laterally abutting said high-k gate dielectric which is present at said gate corners and said gate spacer is laterally abutting said metal-containing gate conductor and is located upon an upper surface of both the gate dielectric and the high-k gate dielectric that is present at the gate corners.

2. The method of claim 1 further comprising forming an interlevel dielectric material having conductively filled contact vias that extend to the surface of the semiconductor substrate which includes source and drain regions of the at least one MOSFET.

3. The method of claim 2 further comprising forming a spacer liner between the gate spacer and the interlevel dielectric material, the metal-containing gate conductor and the upper surface of both the gate dielectric and the high-k gate dielectric that is present at gate corners of said metal-containing gate conductor.

4. The method of claim 2 further comprising strengthening a portion of said high-k gate dielectric located at gate corners of said metal-containing gate conductor to increase bonding therein as compared to said high-k gate dielectric that is located directly beneath said metal-containing gate conductor.

5. The method of claim 4 wherein said strengthening is obtained by ion implantation one of oxygen ions and nitrogen ions or by a thermal process.

6. The method of claim 2 wherein said forming said gate spacer includes forming a void within in an interior region of said gate spacer.

* * * * *